(12) United States Patent
Laville et al.

(10) Patent No.: US 6,953,971 B2
(45) Date of Patent: Oct. 11, 2005

(54) DEVICE FOR ADJUSTING CIRCUITS BEFORE ENCAPSULATION

(75) Inventors: Sébastien Laville, Grenoble (FR); Serge Pontarollo, Saint Martin le Vinoux (FR)

(73) Assignee: STMircoelectronics SA, Montrouge (FR)

(*) Notice: Subject to any disclaimer, the term of this patent is extended or adjusted under 35 U.S.C. 154(b) by 0 days.

(21) Appl. No.: 10/467,706

(22) PCT Filed: Feb. 11, 2002

(86) PCT No.: PCT/FR02/00503
§ 371 (c)(1),
(2), (4) Date: Jan. 20, 2004

(87) PCT Pub. No.: WO02/065551
PCT Pub. Date: Aug. 22, 2002

(65) Prior Publication Data
US 2004/0150049 A1 Aug. 5, 2004

(30) Foreign Application Priority Data
Feb. 12, 2001 (FR) .............................. 01 01872

(51) Int. Cl.⁷ .............................................. H01L 23/62
(52) U.S. Cl. ........................ 257/363; 257/360; 257/355; 257/356
(58) Field of Search ................................. 257/363, 360, 257/355, 356

(56) References Cited

FOREIGN PATENT DOCUMENTS

FR          2795557    * 12/2000    ................. 257/363

* cited by examiner

Primary Examiner—Steven Loke
(74) Attorney, Agent, or Firm—Lisa K. Jorgenson; Allen, Dyer, Doppelt, Milbrath & Gilchrist, P.A.

(57) ABSTRACT

A device for adjusting an integrated circuit before encapsulation includes a first MOS transistor having a gate and a source connected together, and a body connected to a voltage reference. A first resistor is connected in parallel with the first MOS transistor. A second MOS transistor is connected in series with the first MOS transistor. The second MOS transistor has a gate and a source connected together, and a body connected to the voltage reference. A second resistor is connected in parallel with the second MOS transistor. A first terminal is connected to the source of the first MOS transistor, and a second terminal is connected to the source of the second MOS transistor. The first terminal is accessible externally after the integrated circuit has been encapsulated.

25 Claims, 3 Drawing Sheets

DEVICE FOR ADJUSTING CIRCUITS BEFORE ENCAPSULATION

This application is a national phase of PCT International Application No. PCT/FR02/00503 filed on Feb. 11, 2002 under 35 U.S.C. § 371.

FIELD OF THE INVENTION

The present invention relates to analog and digital integrated circuits. These circuits desirably use the smallest possible silicon area to reduce costs while still maintaining high precision.

BACKGROUND OF THE INVENTION

A silicon wafer that has undergone various steps of etching and/or deposition of conductive, semiconductor or insulation layers is put through a sorting step intended to remove defective circuits. The sorting step is followed by a packaging or encapsulation step.

During the sorting step, each circuit on a wafer is tested to check its conformance,to specifications. A circuit can be considered satisfactory, rejected, or alternatively, a candidate for adjustment. Adjustment is performed by imposing given electrical voltages and/or currents on terminals of the integrated circuit. Some of these terminals may no longer be accessible once the circuit is encapsulated.

SUMMARY OF THE INVENTION

In view of the foregoing background, an object of the present invention is to provide a device for adjusting an integrated circuit during the sorting step, prior to its encapsulation.

This and other objects, advantages and features in accordance with the present invention are provided by a device forming part of an integrated circuit, and is disposed between an external contact terminal accessible even after encapsulation and the remainder of the circuit that is intended to perform a specific function.

The integrated electronic circuit may comprise a plurality of MOS transistors. The circuit comprises at least a first and a second MOS transistor arranged in series. Each transistor comprises a gate and a source short-circuited together, and a base connected to ground of the integrated circuit. The circuit may advantageously comprise a first resistance connected in parallel with the first transistor, and a second resistance connected in parallel with the second transistor.

The circuit may further comprise a third transistor connected in series with the first and second transistors. This transistor comprises a gate and a source short-circuited together, and a body connected to ground of the integrated circuit. The circuit may also further comprise a third resistance connected in parallel with the third transistor. This is the global ground of the circuit, which is necessary for its satisfactory operation.

In one embodiment of the invention, the circuit may comprise a connection terminal that is connected to the source of the first transistor and is accessible after the circuit is encapsulated. Alternatively, a resistance can be connected between the terminal and the source of the first transistor.

In another embodiment of the invention, the circuit may comprise a connection terminal that is connected to the source of the second transistor and is not accessible after the circuit is encapsulated, and a connection terminal that is connected to the drain of the second transistor and is not accessible after the circuit is encapsulated.

In yet another embodiment of the invention, the circuit may further comprise a connection terminal that is connected to the drain of the third transistor and is not accessible after the circuit is encapsulated. More generally, the connection terminal connected to the drain of the nth transistor can be connected to the rest of the circuit. The term "series-arranged MOS transistor" is understood to mean transistors in which the source of the n+1th transistor is connected to the drain of the nth transistor.

The MOS transistors may be isolated or non-isolated transistors. The body connector is preferably adjacent the drain.

Another aspect of the present invention is directed to a method of adjusting an electrical resistance in an integrated electronic circuit comprising a plurality of series-connected MOS transistors, each provided with a parallel-connected resistance. The bodies of the MOS transistors may be connected to one another. A first voltage is applied to a MOS transistor at its body, its gate and its source and a second voltage is applied to its drain in order to break down the MOS transistor.

The bodies of the MOS transistors are preferably connected to a global ground of the circuit, and the bodies of the MOS transistors are short-circuited to the gate and to the source of the MOS transistor that is to be broken down.

The first voltage is preferably constant and the second voltage is a monotonic ramp. The first voltage can be zero and the second voltage can be increasing. The breakdown of the MOS transistor can be effected by avalanche of the drain/substrate junction, irreversible breakdown of the drain/substrate junction and a short-circuit between the drain and the source. The difference between the first and second voltages is about 16 V. The breakdown current can be less than 100 mA.

The invention applies to both n-MOS and p-MOS transistors.

The use of "snapback" MOS transistors makes it possible to achieve a short-circuit and thus a resistance inside an integrated circuit by acting on the pins or terminals of the integrated circuit that can be accessed prior to encapsulation. A component formed in this manner takes up little space on a silicon wafer and is therefore inexpensive. The fact that the gate and the source of the MOS transistor are short-circuited ensures permanent blocking of the MOS transistor and keeps it from affecting operation of the rest of the electronic circuit. After breakdown, the MOS transistor can be considered the equivalent of an open circuit.

The invention makes use of a natural characteristic of MOS transistors, that of having parasitic components, particularly a bipolar transistor. In some configurations, such parasitic components are harmful. During electrostatic discharge, circuits can be seriously damaged by turn-on of the parasitic transistor.

Conversely, the invention utilizes the parasitic bipolar transistor of the MOS transistor to make it a short circuit and obtain a resistance having a predetermined value between the drain and the source of the MOS transistor, i.e., between the collector and the emitter of the parasitic bipolar transistor. This component can be considered an antifuse. A fuse is a closed circuit in the normal state and an open circuit after breakdown. Here, the MOS transistor is an open circuit before breakdown and a closed circuit after breakdown, with a low residual resistance value.

BRIEF DESCRIPTION OF THE DRAWINGS

The present invention will be better understood from a study of the detailed description of a few embodiments, taken strictly as non-limiting examples and illustrated by the appended drawings, wherein.

DETAILED DESCRIPTION OF THE PREFERRED EMBODIMENTS

Figure 1:
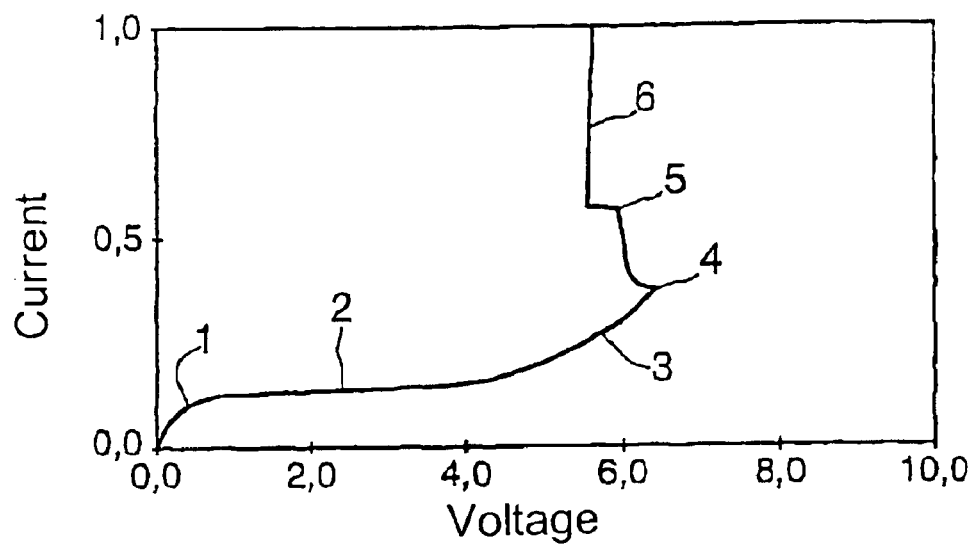
FIG. 1 is a characteristic operating curve of a MOS transistor according to the prior art.

As can be seen in FIG. 1, where the drain voltage is plotted on the abscissa (horizontal axis) and the drain current is plotted on the ordinate (vertical axis), an n-MOS transistor has four operating regions. Region 1 is the conventional linear operation of a MOS transistor. Region 2 is a saturation-mode operation, in which current varies only very slightly with voltage. Region 3 is known as the avalanche region, with a weakening of the drain/substrate junction caused by avalanche of the junction. Finally, Region 4 is the turn-on of the parasitic bipolar transistor, with the curve showing a first breakdown, referenced 5, which is reversible, and a second breakdown, referenced 6, which is destructive and therefore irreversible.

Beyond the second breakdown 6, the current varies extremely rapidly with voltage, with the slope of the curve being almost vertical. Since the breakdown process, also known as a second breakdown is irreversible, it is possible to move along the curve beginning at the second breakdown! 6 by moving up, which translates into a decrease in the resistance offered by the MOS transistor broken down in this way, insofar as the current can be seen to increase against a substantially constant drain voltage.

Figure 2:
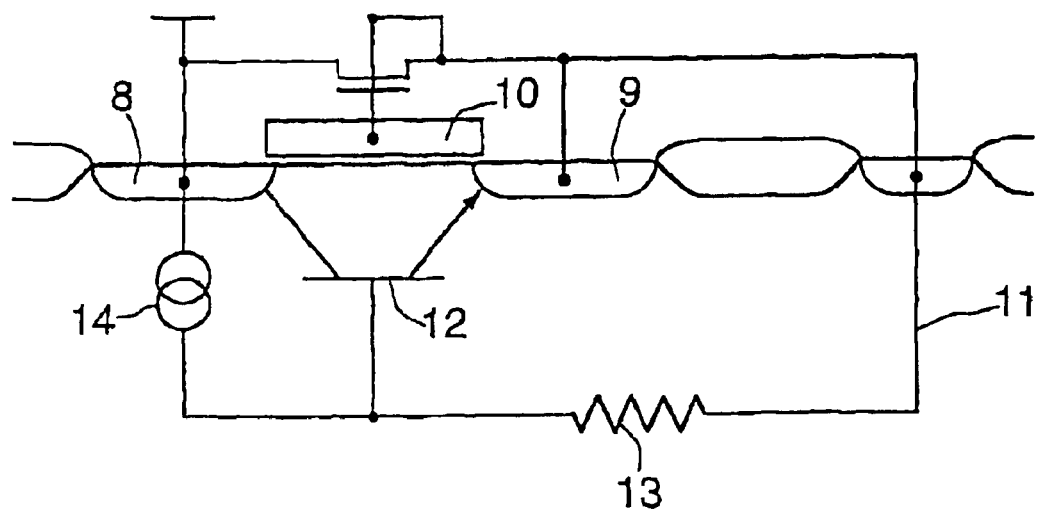
FIG. 2 is a cross-sectional view of a MOS transistor according to the present invention.

FIG. 2 shows the structure of the various components of the MOS transistors. The MOS transistor comprises a drain 8, a source 9 and a gate 10 formed on a body 11, also known as the bulk. A parasitic bipolar transistor 12 forms in the body 11. Its collector is formed by the drain 8 and its emitter by the source 9, and its base can be modeled as connected to ground by a substrate resistance 13 and by a current source 14 connected to the drain 8.

In the arrangement according to the invention, the drain 8 is connected to a first supply voltage, while the source 9, gate 10 and body 11 are short-circuited and are connected to a second supply voltage. When the MOS transistor reaches saturation, a high voltage on the drain triggers avalanche of the drain/body junction by generating electron-hole pairs, thus creating a body current. The voltage at the terminals of the body resistance increases, thereby biasing the source/body junction. The parasitic bipolar transistor thus undergoes flashover and the phenomenon of breakdown occurs.

At high currents the component goes into the irreversible second breakdown state, represented by destruction of the polysilicon crystal lattice of the channel formed between the drain and the source. After avalanche of the collector/body junction of the parasitic bipolar transistor, the emitter connected to ground serves to forward-bias the body/emitter junction, which causes the snapback effect. To trigger the avalanche phenomenon, a sufficient voltage must be imposed on the drain to reverse-bias the drain/body junction. This voltage depends on the doping characteristics and is proportional to the square of the electrical field.

The current generator 14 shown in FIG. 2 between the collector and the body of the parasitic bipolar transistor simulates the leakage currents of the drain/body junction in an initial phase. Thereafter, it serves to simulate avalanche of the junction and biasing of the parasitic bipolar npn-type transistor.

By way of example, tests were performed using HF4 CMOS technology with an n-MOS transistor having the following channel dimensions: width (W)=1 $\mu$m and length (L)=0.7 $\mu$m. The source was grounded, and a voltage ramp ranging from 8 to 18 V with current limitation was applied to the drain. With a current of 2 mA, a post-breakdown resistance of 300 ohms was created. With a current of 10 mA, a post-breakdown resistance of 60 ohms was obtained, and with a current of 100 mA, a post-breakdown resistance of 11 ohms was obtained. It will be noted that with a drain voltage of less than 11 V, the drain/base junction is not in avalanche, and therefore no current passes through the drain/source channel. Beyond this voltage the phenomenon sets in, with the creation of a conductive path allowing the passage of current. Once the breakdown voltage is reached, all the available current flows into the channel and a resistance is created.

It is particularly advantageous to use transistors whose channel is as short as possible, since the shorter the channel, the lower the breakdown voltage, due to the increase in the drain current and the increase in the number of electron-hole pairs generated. The channel width is constant. A decrease in the channel width brings about a decrease in the voltage and the current of the second breakdown 6 illustrated in FIG. 1. Even if the width of the channel has no effect on the voltage of the first breakdown 5, a reduced width will increase the heating effect of the second breakdown 6, since the lines of force will be more unidirectional, implying a decrease in the torque of the second breakdown. It is therefore particularly advantageous to use small-sized MOS transistors.

When a MOS transistor is used in the snapback mode, the substrate is connected to the lowest potential of the circuit to reverse-bias all the parasitic diodes existing between drain 8 and source 9, on the one hand, and body 11 on the other. Source 9 and base 11 are short-circuited. Gate 10 is also short-circuited to source 9 and to the body 11 to deactivate the transistor.

Resistances arranged in parallel can be adjusted with this type of snapback MOS transistor. Reference is directed to French Patent No. 2,795,557 for more information.

Figure 3:
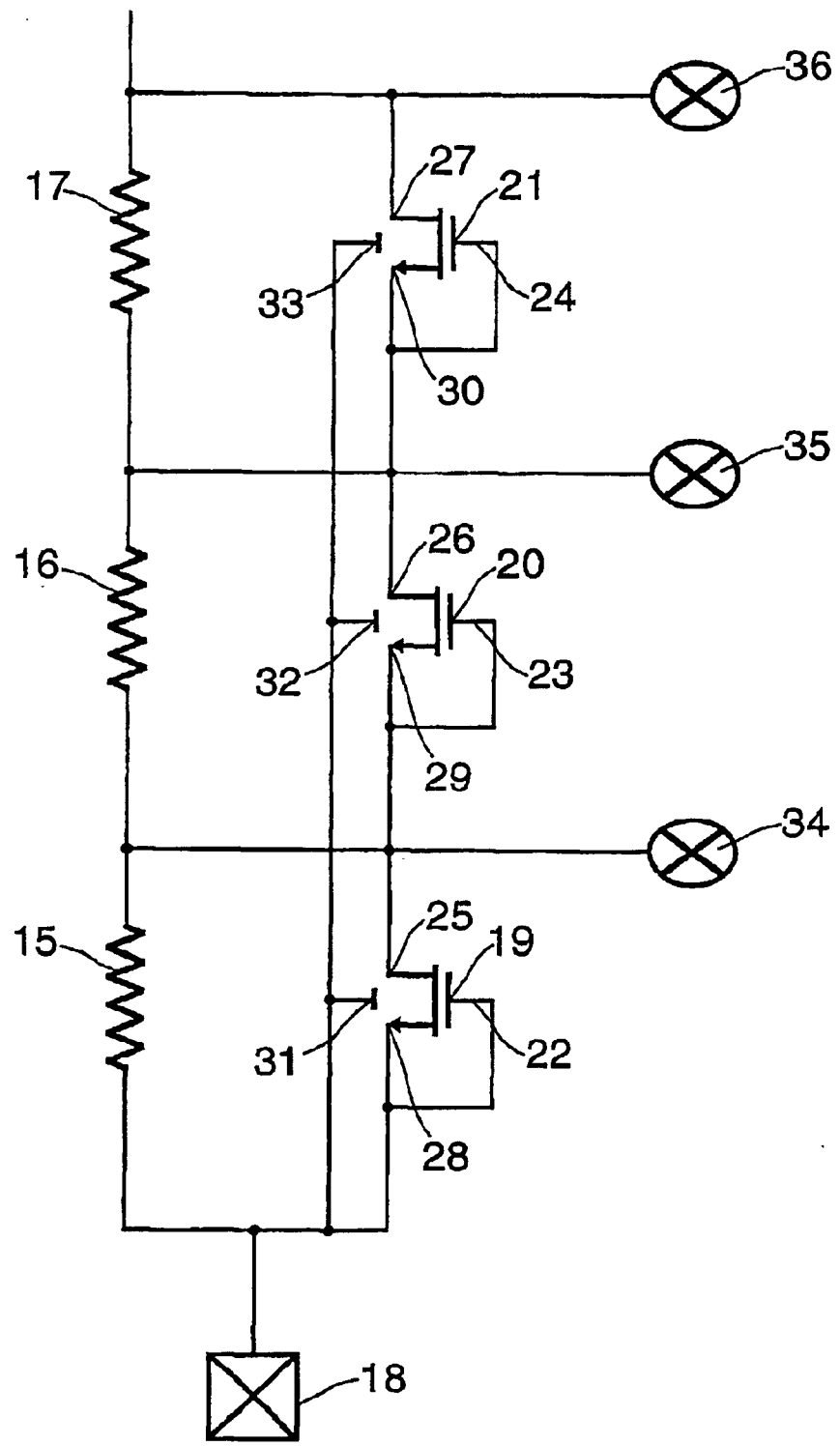
FIG. 3 is a diagram of the device according to the present invention.

FIG. 3 shows an embodiment of the invention comprising three series-arranged resistances to be adjusted, referenced 15, 16 and 17. Resistance 15 is connected to a ground terminal 18 that will be connected to one of the external pins or terminals of the circuit at the time of encapsulation, and resistance 17 is connected to the rest of the circuit (not shown). The device further comprises three MOS transistors 19, 20, 21. Each transistor is provided with a gate, respectively 22, 23 and 24, a drain, respectively 25, 26 and 27, a source, respectively 28, 29 and 30, and a body, respectively 31, 32 and 33.

Transistor 19 is connected in parallel with resistance 15, transistor 20 in parallel with resistance 16 and transistor 21 in parallel with resistance 17. The gate and the source of each transistor 19, 20 and 21 are short-circuited. Bodies 31 to 33 of transistors 19 to 21 are all connected to terminal 18. Gate 22 and source 28 of transistor 19 are connected to terminal 18. Drain 25 of transistor 19 and gate 23 and source 29 of transistor 20 are connected to the common point between resistances 15 and 16 and to an adjustment terminal 34 that can be no longer accessible after the circuit is encapsulated. Drain 26 of transistor 20 and gate 24 and source 30 of transistor 21 are connected to the common point between resistances 16 and 17 and to an adjustment terminal 35 that can be no longer accessible after the circuit is encapsulated. Drain 27 of transistor 21 is connected to the other terminal of resistance 17, to the rest of the circuit (not shown) and to an adjustment terminal 36 that can be no longer accessible after the circuit is encapsulated To break down transistor 21, terminals 18 and 35 are together connected to ground and a positive voltage ramp is applied to terminal 36. If terminal 18 were left unconnected, the snapback phenomenon would not occur due to the impossibility of avalanching the drain/body junction and thus of forward-biasing the body/transmitter junction.

If transistor 20 is to be broken down, terminals 18 and 34 are connected together and a positive voltage ramp is applied to bump 35. To break down transistor 19, a positive voltage is applied to terminal 34 and terminal 18 is connected to ground.

A system of low-value series-connected resistances can thus be adjusted by MOS transistors in a reproducible and reliable manner. A non-isolated MOS transistor takes up much less area than an isolated MOS transistor, for example an area of 7 $\mu$m out of 14 $\mu$m instead of 40 $\mu$m out of 40 $\mu$m, thus dividing the occupied silicon area by about 16.

Breakdown of the isolated snapback MOS transistors is difficult to achieve due to the presence of a second, parasitic bipolar transistor in which the collector is formed by the drain of the MOS transistor, the emitter by the source and the base by the body or bulk. This second, parasitic transistor is capable of stealing most of the current sent by a breakdown terminal to the drain of the MOS transistor. As a result, the post-breakdown resistance can vary between 100 ohms and 1 ohms, compared to the resistance of 10 ohms that is obtained in a reproducible manner when the non-isolated MOS structure is broken down.

The term isolated MOS transistor is understood here to mean a MOS transistor whose substrate and body are separated by a dielectric layer. Vertical and especially lateral isolation stresses encourage the use of large silicon areas to increase the dimensions of the body and decrease the gain of the second, parasitic bipolar transistor.

Figure 4:
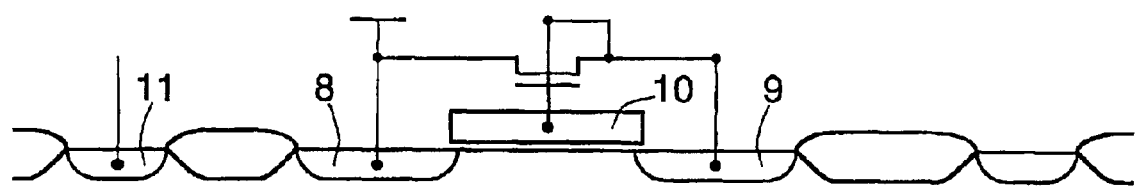
FIG. 4 is a cross-sectional view of a variation of a MOS transistor according to the present invention.

Without excluding isolated MOS transistors, it is preferred to use non-isolated MOS transistors that prevent the flow of leakage currents from the body to the substrate. The body and the substrate are at the same potential. Further, it is particularly advantageous to arrange the body connector as close as possible to the drain for reasons of current line distribution during breakdown. The body layer, a p-type layer in an n-MOS transistor, may or may not be ring-shaped. In both cases, the body connector, i.e., the lead-out to the connection levels, is arranged closer to the drain than to the source as illustrated in FIG. 4.

The present invention thus enables series-arranged resistances to be adjusted in a precise and reproducible manner with the aid of economical MOS transistors occupying a reasonable silicon area.

What is claimed is:

1. An integrated circuit comprising:
   a first MOS transistor comprising a gate and a source connected together, a drain, and a body connected to a voltage reference;
   a first resistor connected in parallel to the drain and source of said first MOS transistor;
   a second MOS transistor connected in series with said first MOS transistor, said second MOS transistor comprising a gate and a source connected together, a drain, and a body connected to the voltage reference; and
   a second resistor connected in parallel to the drain and source of said second MOS transistor.

2. An integrated circuit according to claim 1, further comprising a third MOS transistor connected in series with said first and second MOS transistors, said third MOS transistor comprising a gate and a source connected together, a drain, and a body connected to the voltage reference.

3. An integrated circuit according to claim 2, further comprising a third resistor connected in parallel to the drain and source of said third MOS transistor.

4. An integrated circuit according to claim 1, further comprising a first terminal connected to the source of said first MOS transistor, said first terminal being accessible after said first and second MOS transistors are encapsulated.

5. An integrated circuit according to claim 4, further comprising:
   a second terminal connected to the source of said second MOS transistor, said second terminal not being accessible after said first and second MOS transistors are encapsulated; and
   a third terminal connected to the drain of said second MOS transistor, said third terminal not being accessible after said first and second MOS transistors are encapsulated.

6. An integrated circuit according to claim 1, wherein each MOS transistor occupies an area less than 500 $\mu m^2$.

7. An integrated circuit according to claim 1, wherein each MOS transistor occupies an area less than 200 $\mu m^2$.

8. An integrated circuit according to claim 1, wherein the voltage reference is ground.

9. An integrated circuit comprising:
   a first MOS transistor comprising a gate and a source connected together, a drain, and a body connected to a voltage reference;
   a first resistor connected in parallel to the drain and source of said first MOS transistor;
   a second MOS transistor connected in series with said first MOS transistor, said second MOS transistor comprising a gate and a source connected together, a drain, and a body connected to the voltage reference;
   a second resistor connected in parallel to the drain and source of said second MOS transistor;
   an encapsulating material surrounding said first and second MOS transistors, and said first and second resistors; and
   a first terminal connected to the source of said first MOS transistor, the first terminal being accessible externally from said encapsulating material.

10. An integrated circuit according to claim 9, further comprising a second terminal connected to the source of said second MOS transistor, said second terminal not accessible externally from said encapsulating material.

11. An integrated circuit according to claim 10, further comprising a third terminal connected to the drain of said second MOS transistor, said third terminal not accessible externally from said encapsulating material.

12. An integrated circuit according to claim 9, further comprising a third MOS transistor connected in series with said first and second MOS transistors, said third MOS transistor comprising a gate and a source connected together, a drain, and a body connected to the voltage reference.

13. An integrated circuit according to claim 12, further comprising a third resistor connected in parallel to the drain and source of said third MOS transistor.

14. An integrated circuit according to claim 9, wherein each MOS transistor occupies an area less than 500 $\mu m^2$.

15. An integrated circuit according to claim 9, wherein each MOS transistor occupies an area less than 200 $\mu m^2$.

16. An integrated circuit according to claim 9, wherein the voltage reference is ground.

17. A method for adjusting an integrated circuit comprising a first MOS transistor comprising a gate and a source connected together, a drain, and a body connected to a voltage reference; a first resistor connected in parallel to the drain and source of the first MOS transistor; a second MOS transistor connected in series with the first MOS transistor, the second MOS transistor comprising a gate and a source connected together, a drain, and a body connected to the voltage reference; and a second resistor connected in parallel to the drain and source of the second MOS transistor, the method comprising:

applying a first voltage to the body, gate and source of the first MOS transistor; and applying a second voltage to the drain of the first MOS transistor causing breakdown thereof.

18. A method according to claim 17, wherein the first voltage is constant, and the second voltage is a ramp voltage.

19. A method according to claim 18, wherein the first voltage is ground.

20. A method according to claim 17, wherein the voltage reference is ground.

21. A method according to claim 17, further comprising encapsulating the integrated circuit after applying the first and second voltages.

22. A method according to claim 21, wherein the integrated circuit further comprising a first terminal connected to the source of the first MOS transistor, with the first terminal being accessible after the first and second MOS transistors are encapsulated.

23. A method according to claim 22, wherein the integrated circuit further comprises a second terminal connected to the source of the second MOS transistor, the second terminal not being accessible after the first and second MOS transistors are encapsulated; and a third terminal connected to the drain of the second MOS transistor, the third terminal not being accessible after the first and second MOS transistors are encapsulated.

24. A method according to claim 17, wherein the integrated circuit further comprises a third MOS transistor connected in series with the first and second MOS transistors, the third MOS transistor comprising a gate and a source connected together, a drain, and a body connected in parallel to the drain and source of the third MOS transistor.

25. A method according to claim 17, wherein occupies an area less than 200 $\mu m^2$.

* * * * *

UNITED STATES PATENT AND TRADEMARK OFFICE
CERTIFICATE OF CORRECTION

PATENT NO. : 6,953,971 B2
DATED : October 11, 2005
INVENTOR(S) : Sébastien Laville and Serge Pontarollo It is certified that error appears in the above-identified patent and that said Letters Patent is hereby corrected as shown below:

Column 1,
Line 22, delete "conformance,to" insert -- conformance to --.

Column 3,
Line 32, delete "breakdown!" insert -- breakdown, --.

Column 5,
Line 7, delete "encapsulated" insert -- encapsulated. --.

Column 8,
Line 25, delete "wherein occupies" insert -- wherein each MOS transistor occupies --.

Signed and Sealed this

Seventh Day of March, 2006

JON W. DUDAS
*Director of the United States Patent and Trademark Office*